INVENTOR
JOHN G. MORRISON
BY
H P Terry
ATTORNEY

Nov. 10, 1970 J. G. MORRISON 3,539,909
CONTROLLABLE ELECTRONIC ATTENUATOR HAVING
ZERO DIFFERENTIAL PHASE SHIFT
Filed Jan. 28, 1969 2 Sheets-Sheet 2

INVENTOR
JOHN G. MORRISON
BY
H P Terry
ATTORNEY

United States Patent Office 3,539,909

Patented Nov. 10, 1970

3,539,909

CONTROLLABLE ELECTRONIC ATTENUATOR HAVING ZERO DIFFERENTIAL PHASE SHIFT

John G. Morrison, Syosset, N.Y., assignor to Sperry Rand Corporation, a corporation of Delaware Filed Jan. 28, 1969, Ser. No. 794,539

Int. Cl. H02j 3/18

U.S. Cl. 323—111 5 Claims

ABSTRACT OF THE DISCLOSURE

An electronic attenuator circuit comprising a voltage divider having a switch connected thereto for controlling the voltage ratio between the input and output terminals of the divider and operating in conjunction with a diode and resistor network energized by first and second voltage sources for forward and reverse biasing the diode accordingly as the control switch is opened and closed thereby causing the output signal to have the same phase shift relative to the input signal for both states of the switch.

BACKGROUND OF THE INVENTION

The present invention relates to controllable electronic attenuator circuits comprising a voltage divider network having a switch connected thereto for adjusting the voltage division between the input and output terminals of the attenuator and more particularly to means for eliminating differential phase shift between the input and output voltages for both the open and closed states of the switch.

In prior art electronic attenuator circuits wherein a switch connected to a voltage divider network is opened and closed to control the amplitude of the signal at the output terminal of the attenuator relative to the signal amplitude applied to its input terminal, the phase of the output signal is dependent on whether the switch is opened or closed. This occurs because an inherent capacitance exists across the open contacts of any switch. Consequently, when the switch contacts are open, its switch capacitance forms part of the attenuating circuit whereas when the switch is closed its capacitance is removed from the circuit. The differential phase shift which is introduced in the course of operating the attenuator is undesirable and in some instances intolerable especially, for example, where precise amplitude control is required or the load connected to the attenuator is an amplifier stage which is sensitive to the phase of the signal applied to its input terminal.

SUMMARY OF THE INVENTION

The present invention eliminates phase shift caused by a switching mechanism in controllable attenuator circuits by the provision of a circuit comprising a diode and two resistors which are connected to the attenuator and arranged to operate in a manner such that the switch is essentially removed from the circuit when its contacts are open circuited. A preferred embodiment of the invention includes a basic attenuator circuit comprising the series combination of two impedance elements and a switch having one of its contacts connected to ground. An input signal referenced to ground is applied across the full network and the output signal, which is also referenced to ground, is obtained at the junction of the two resistors. A diode interconnects the input terminal with the ungrounded switch contact and individual resistors couple each side of the diode to a discrete voltage source. The resistors and voltage sources operate to reverse bias the diode when the switch is closed whereupon the output voltage is attenuated simply in accordance with the ratio of the impedances. On the other hand, when the switch is opened and its inherent capacitance is present in the circuit, the diode is forward biased thereby coupling the input terminal directly to the ungrounded switch contact. As a result, the switch is effectively removed from the circuit when its contacts are opened. Hence, the phase of the output signal relative to the input signal is the same for both the open and closed states of the switch. Moreover, as will be discussed more fully in the subsequent detailed description, the invention provides the same relative phase shift for both states of the switch irrespective of the nature of the load which is connected to the attenuator. Thus, a vacuum tube or transistor amplifier stage having a high input capacitance will not introduce relative phase shift between the attenuating and non-attenuating modes.

BRIEF DESCRIPTION OF THE DRAWINGS

The invention will be described with reference to the following drawings in which similar components are identified by the same numeral and letter designations.

DESCRIPTION OF THE PREFERRED EMBODIMENT

Figure 1:
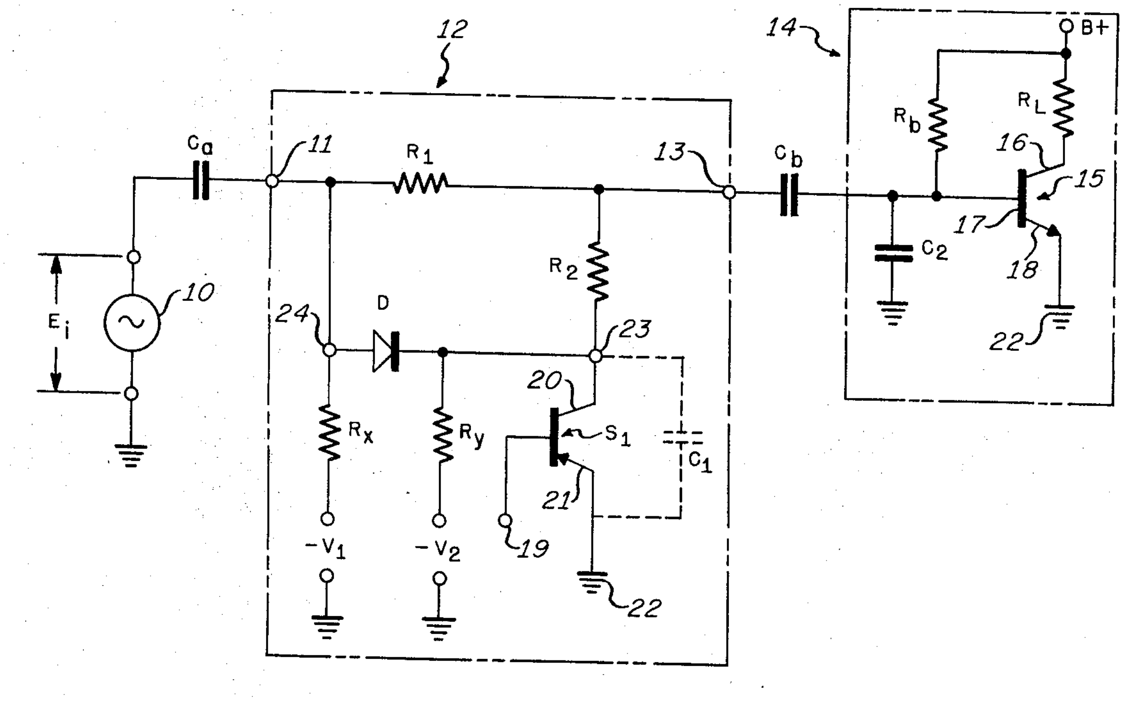
FIG. 1 is a circuit diagram of the preferred embodiment of the invention.

Referring to FIG. 1, an A.C. signal $E_1$ provided at the output terminals of signal source 10 is coupled through D.C. blocking capacitol $C_a$ to the input terminal 11 of attenuator 12 comprising a diode D, resistors $R_x$ and $R_y$, voltage divider resistors $R_1$ and $R_2$ and transistor switch $S_1$. Capacitor $C_1$ is not an actual capacitor connected across switch $S_1$ but represents the inherent capacitance existing across the collector-to-emitter terminals of the transistor when it is in a non-conducting state. Obviously, other kinds of switches could be used in place of the transistor switch. In any case, capacitor $C_1$ would represent the capacitance across the open terminals of the switch. As previously mentioned, the function of the invention is to eliminate phase shift caused by both this switch capacitance and capacitance inherent in load 14 connected through D.C. blocking capacitor $C_b$ to the attenuator output terminal 13 at the junction of resistors $R_1$ and $R_2$. Blocking capacitors $C_a$ and $C_b$ have relatively large capacitance so as to present a very low impedance to the A.C. input signal. The load is a transistor amplifier comprising an npn transistor 15 having its collector terminal 16 connected through load resistor $R_L$ to power supply $B^+$ which also connects through bias resistor $R_b$ to base terminal 17 to provide the required base current through the base-to-emitter terminal 18 coupled to ground 22. Capacitor $C_2$, as in the case of capacitor $C_1$, is not an actual component but represents the input capacitance appearing across the base-to-emitter and base-to-collector terminals of the amplifier. It should be understood that any kind of load, represented typically as an impedance $Z_L$, can be connected to the attenuator although it is expected that the load will generally be an amplifier stage of some sort employing either transistors or vacuum tubes and therefore will have a comparatively large reactive component in its input impedance.

Figure 2:
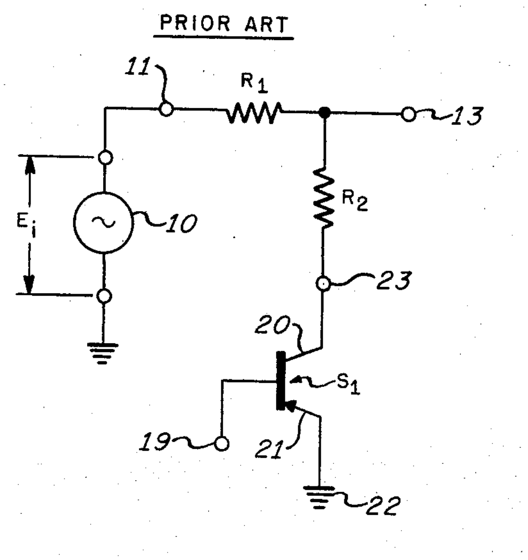
FIG. 2 is a circuit diagram of a prior art attenuator circuit.
Figure 3:
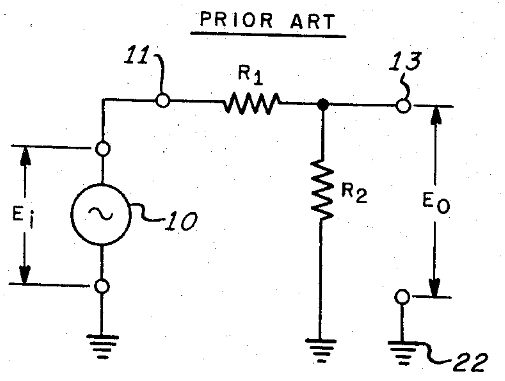
FIGS. 3 and 4 are equivalent circuits of the prior art circuit of FIG. 2 for the condition where the attenuator control switch is closed and opened respectively.

Before proceeding to a detailed discussion of the operation of the invention, consider the prior art attenuator shown in FIG. 2. When transistor switch $S_1$ is driven into saturation by a negative voltage applied to its base terminal 19, the impedance between the collector 20 and emitter 21 is very small so point 23 is effectively connected to ground 22. Moreover, since blocking capacitors $C_a$ and $C_b$ have comparatively large capacitance they may be regarded as short circuits for the purpose of A.C. analysis. Hence, the equivalent circuit for the attenuator with switch $S_1$ closed is as shown in FIG. 3 whereupon the voltage $E_o$ at the output terminal 13 of the attenuator is related to the input voltage $E_i$ by the ratio of the resistances of resistors $R_1$ and $R_2$, that is, $$\frac{E_o}{R_2}=\frac{E_i}{R_1+R_2} \text{ so } E_o=E_i\cdot\frac{R_2}{R_1+R_2}$$

Figure 4:
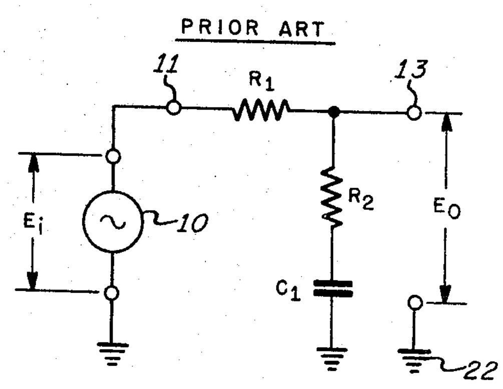

Since no reactive terms appear in this equation, it is seen that the output voltage is in phase with the input voltage. In the non-attenuating mode, on the other hand, switch $S_1$ is open (non-conducting) so that the equivalent circuit of the attenuator is as shown in FIG. 4. In this instance, the switch capacitance $C_1$ appearing across the output terminal to ground causes output voltage $E_o$ to be phase shifted relative to $E_i$.

Figure 5:
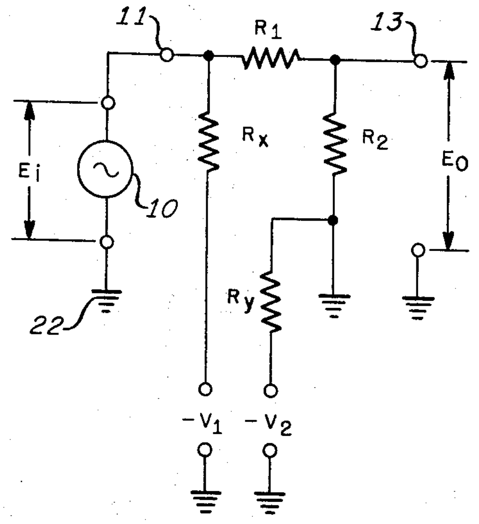
FIGS. 5 and 6 are equivalent circuits of the preferred embodiment of FIG. 1 for the condition where the attenuator control switch is closed and opened respectively.

Now refer again to FIG. 1 for an understanding of how the invention provides for the output voltage to have the same phase relative to the input voltage for both states of the switch. For the attenuation mode, where switch $S_1$ is closed by means of a negative signal applied to base terminal 19, point 23 is essentially connected to ground and voltage source $-V_1$ causes electrons to flow through resistors $R_x$, $R_1$ and $R_2$ to produce a negative potential at point 24. This reverse biases diode D so that it presents an open circuit to the A.C. input signal whereupon the A.C. equivalent circuit of attenuator 12 is as shown in FIG. 5. It is thus seen that the input voltage $E_i$ appears directly across $R_x$ and is then applied to $R_1$ and $R_2$ with the result that the output voltage is determined by the ratio of the resistances of resistors $R_1$ and $R_2$ as in the case of the prior art attenuator.

Figure 6:
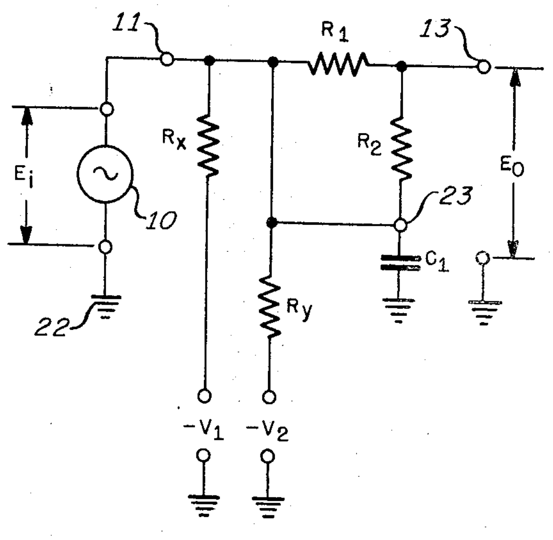

In the non-attenuation mode with the negative signal removed from base terminal 19, $S_1$ is open and electrons flow from source $-V_2$, which is more negative than source $-V_1$, through resistors $R_y$, $R_2$, $R_1$ and $R_x$ and thereby establish a potential at point 23 more negative than the potential at point 24 so that diode D is forward biased and presents a short circuit to the A.C. input signal. Under this condition, input signal $E_i$ is connected directly to point 23 as shown in FIG. 6. As a result, $E_i$ appears directly at the attenuator output terminal 13 so that the output signal is in phase with the input signal exactly as it was when the switch was closed.

For the case where the switch is closed (FIG. 5) the Thevenin impedance looking from output terminal 13 back toward A.C. source 10 is simply $R_1$ in parallel with $R_2$ or $$\frac{R_1R_2}{R_1+R_2}$$

and the A.C. Thevenin voltage at output terminal 13 is $$E_i\cdot\frac{R_2}{R_1+R_2}$$

The ratio of this Thevenin voltage to the Thevenin resistance is $E_i/R_1$ which is the same as the ratio of the voltage to the resistance looking from output terminal 13 back toward A.C. source 10 in the circuit of FIG. 6 where the switch is open. Thus, a reactive load element connected to the attenuator will produce the same relative phase shift whether the switch is open or closed. This result does not obtain for the prior art attenuator since capacitor $C_1$ is present in this circuit when the control switch is open.

An attenuator constructed in the aforedescribed manner has utility over a range of frequencies extending from only a fraction of a cycle up to tens of megacycles and it will be apparent to those skilled in the art that the invention also has utility with voltage divider attenuating circuits including more than two impedance elements or configurations in which the switching mechanism is connected in parallel with one or more of the impedances. Moreover, it will be recognized that the voltage divider can be constructed of reactive components as well as resistors, the essential requirement being that like impedance elements, that is, all resistors, all capacitors, or all inductors must be used.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An electronic attenuator circuit comprising (a) a voltage divider including a plurality of like impedance elements, (b) an input terminal connected to the divider for applying an alternating current input signal thereto and an output terminal connected to the divider for providing an output signal proportional to the input signal, (c) a switch connected to the voltage divider for controlling the proportion of the input signal transmitted to the output terminal in accordance wtih whether the switch contacts are open or closed, (d) a unidirectional current conductive device interconnecting the input terminal and one switch contact, (e) a first resistor connected at one end to the input terminal and adapted to be connected at the other end to a first voltage source for biasing the unidirectional current conductive device such that the input signal is precluded from passing therethrough when the switch contacts are closed, and (f) a second resistor connected at one end to said one switch contact and adapted to be connected at the other end to a second voltage source which provides a voltage greater than that provided by the first source and thereby operates to bias the unidirectional current conductive device such that the input signal is transmitted therethrough when the switch contacts are open.

2. The apparatus of claim 1 wherein the switch is operative when closed to adjust the amplitude of the output signal to a level which is a fraction of the amplitude of the input signal and operative when open to adjust the amplitude of the output signal to be equal to the input signal.

3. The apparatus of claim 1 wherein a signal source connected to the input terminal is connected in parallel with the open contacts of the switch when the unidirectional current conductive device is forward biased whereby the attenuator circuit presents equivalent source impedances for both states of the switch with respect to a load connected to the output terminal.

4. The apparatus of claim 1 wherein the impedance elements are connected in series to one switch contact and the other switch contact is connected to a reference point, the input signal is applied across the entire circuit and the output signal is provided across a part of the circuit with respect to the reference point.

5. The apparatus of claim 4 wherein the impedance elements are first and second resistors having the output terminal connected to the junction therebetween, the unidirectional current conductive device is a diode and the switch is a transistor having base, emitter and collector terminals, the base terminal being adapted for connection to a potential source for driving the transistor beween cut-off and saturation accordingly as the potential source establishes a reverse and forward bias across the base-to-emitter terminals.

References Cited

UNITED STATES PATENTS

| | | |
|---|---|---|
| 3,372,287 | 3/1968 | Metcalf. |
| 3,458,799 | 7/1969 | Collings. |

J D MILLER, Primary Examiner

G. GOLDBERG, Assistant Examiner

U.S. Cl. X.R.

307—237, 295; 323—121; 333—80